(12) United States Patent
Schumacher et al.

(10) Patent No.: US 7,979,835 B1
(45) Date of Patent: Jul. 12, 2011

(54) METHOD OF ESTIMATING RESOURCE REQUIREMENTS FOR A CIRCUIT DESIGN

(75) Inventors: Paul R. Schumacher, Berthoud, CO (US); Ian D. Miller, Charlotte, NC (US); David B. Parlour, Fox Chapel, PA (US); Jorn W. Janneck, San Jose, CA (US); Pradip Kumar Jha, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 638 days.

(21) Appl. No.: 12/041,182

(22) Filed: Mar. 3, 2008

(51) Int. Cl.
*G06F 17/50* (2006.01)

(52) U.S. Cl. .................. 716/136; 716/117; 716/132

(58) Field of Classification Search .................. None
See application file for complete search history.

(56) References Cited

U.S. PATENT DOCUMENTS

| | | | |
|---|---|---|---|
| 6,578,174 B2 * | 6/2003 | Zizzo ................... | 716/103 |
| 7,028,283 B1 | 4/2006 | Keller | |
| 7,058,921 B1 * | 6/2006 | Hwang et al. ............ | 716/116 |
| 7,165,229 B1 | 1/2007 | Gathoo et al. | |
| 7,376,929 B1 | 5/2008 | Grant | |
| 7,464,345 B2 | 12/2008 | Martin et al. | |
| 7,631,284 B1 * | 12/2009 | Perry et al. ............. | 716/138 |
| 7,735,050 B2 * | 6/2010 | Yu et al. ................. | 716/104 |
| 7,823,092 B1 * | 10/2010 | Perry ..................... | 716/101 |
| 2002/0072893 A1 | 6/2002 | Wilson | |
| 2002/0188910 A1 | 12/2002 | Zizzo | |
| 2005/0183055 A1 | 8/2005 | Herrera | |
| 2007/0028196 A1 | 2/2007 | Martin et al. | |
| 2008/0134127 A1 | 6/2008 | Allen et al. | |

OTHER PUBLICATIONS

Bilavarn et al., "Fast Prototyping of Reconfigurable Architectures from a C Program," 2003 Int'l Symposium on Circuits and Systems, 4 pages.*
Bjureus et al., "FPGA Resourcce and Timing Estimation from Matlab Execution Traces," CODES'02, 2002 ACM, pp. 31-36.*
Dutt et al., "Bridging High-Level Synthesis to RTL Technology Libraries," 28th ACM/IEEE Design Automation Conference, 1991 ACM, pp. 526-529.*
Haldar et al., "A System for Synthesizing Optimized FPGA Hardware from Matlab," 2001 IEEE, pp. 314-319.*
Jha et al., "Rapid Estimation for Parameterized Components in High-Level Synthesis," IEEE Trans. on VLSI Systems, vol. 1, No. 3, Sep. 1993, pp. 296-303.*
Shankar et al., "Annotation Methods and Application Abstractions," 2007 IEEE, 5 pages.*
Shi et al., "A System Level Resource Estimation Tool for FPGAs," 2004 Int'l Conference of Field Programmable Logic and Applications, 11 pages.*
Vootukuru et al., "Partitioning of Register Level Designs for Multi-FPGA Synthesis," pp. 99-106, no date.*
U.S. Appl. No. 11/707,616, filed Feb. 16, 2007, Schumacher.
U.S. Appl. No. 12/041,150, filed Mar. 3, 2008, Schumacher et al.

(Continued)

*Primary Examiner* — Leigh Marie Garbowski
(74) *Attorney, Agent, or Firm* — John J. King; Lois D. Cartier

(57) ABSTRACT

A method of estimating resource requirements for a circuit design is disclosed. The method comprises identifying intermediate circuit modules of a netlist associated with the circuit design; accessing a library of resource requirements for intermediate circuit modules of netlists for circuit designs; selecting intermediate circuit modules of the library according to predetermined parameters for the circuit design; and generating an estimate of resource requirements for the circuit design based upon resource requirements of the selected intermediate circuit modules.

20 Claims, 13 Drawing Sheets

OTHER PUBLICATIONS

U.S. Appl. No. 12/041,167, filed Mar. 3, 2008, Schumacher et al.

Kulkarni et al., "Fast Area Estimation to Support Compiler Optimizations in FPGA-based Reconfigurable Systems," *Proceedings of the 10th Annual IEEE Symposium on Field-Programmable Custom Computing Machines (FCCM'02)*, Apr. 22-24, 2002, pp. 239-247, Napa, California.

Kulkarni et al., "Compile-Time Area Estimation for LUT-Based FPGAs," *ACM Transactions on Design Automation of Electronic Systems*, Jan. 2006, pp. 1-19, vol. 11, No. 1.

Menn et al., "Controller Estimation for FPGA Target Architectures During High-Level Synthesis," *15th International Symposium on System Synthesis (ISSS'02)*, Oct. 2-4, 2002, pp. 56-61, Kyoto, Japan.

Milder et al., "Fast and Accurate Resource Estimation of Automatically Generated Custom DFT IP Cores," *Proceedings of the 2006 ACM/SIGDA 14th International Symposium on Field Programmable Gate Arrays*, Feb. 22-24, 2006, pp. 211-220, Monterey, California.

Xu et al., "ChipEst-FPGA: A Tool for Chip Level area and Timing Estimation of Lookup Table Based FPGAs for High Level Applications," *Proceedings of the ASP-DAC Design Automation Conference 1997*, Jan. 28-31, 1997, pp. 435-440, Chiba, Japan.

Xilinx, Inc., "CORE Generator Guide," Version 4.1i, copyright 1991-2001, pp. 1-170, available from Xilinx, Inc., 2100 Logic Drive, San Jose, California 95124, USA.

Bilavarn, Sebastien et al., "Area Time Power Estimation for FPGA Based Designs at a Behavioral Level," *Proc. of the 7th IEEE International Conference on Electronics, Circuits, and Systems*, Dec. 17, 2000, pp. 524-527, vol. 1, IEEE, Piscataway, New Jersey, USA.

Brandolese, Carlo et al., "An Area Estimation Methodology for FPGA Based Designs at SystemC-Level," *Proc. of the 41st Annual Conference on Design Automation*, Jun. 7, 2004, pp. 129-132, IEEE Computer Society, Washington, DC, USA.

Nayak, Anshuman et al., "Accurate Area and Delay Estimators for FPGAs," *Proc. of the IEEE Conference on Design, Automation and Test in Europe*, Mar. 4, 2002, pp. 862-869, IEEE, Piscataway, New Jersey, USA.

Xu, Min et al., "Area and Timing Estimation for Lookup Table Based FPGAs," *Proc. of the 1996 European Design and Test Conference*, Mar. 11, 1996, pp. 151-157, IEEE, Piscataway, New Jersey, USA.

Schumacher, Paul et al., "Fast and Accurate Resource Estimation of RTL-Based Designs Targeting FPGAS," *2008 International Conference on Field Programmable Logic and Applications (FPL '08)*, Sep. 8-10, 2008, pp. 59-64, Heidelberg, Germany.

\* cited by examiner

| | Set 1 | Set 2 | Set 3 | Set 4 | Set 5 | Set 6 | Set 7 | Set 8 | Set 9 | ... |
|---|---|---|---|---|---|---|---|---|---|---|
| Slices | 5 | 5 | 5 | 5 | 5 | 5 | 5 | 5 | 5 | ... |
| Total LUTs | 6 | 6 | 6 | 6 | 6 | 6 | 6 | 6 | 6 | ... |
| Logic LUTs | 4 | 4 | 4 | 3 | 4 | 4 | 4 | 4 | 4 | ... |
| Ram LUTs | 2 | 2 | 2 | 3 | 2 | 2 | 2 | 2 | 2 | ... |
| BRAMs | 1 | 1 | 1 | 1 | 1 | 1 | 1 | 1 | 1 | ... |
| DSPs | 1 | 1 | 1 | 1 | 1 | 1 | 1 | 1 | 1 | ... |
| ⋮ | ⋮ | ⋮ | ⋮ | ⋮ | ⋮ | ⋮ | ⋮ | ⋮ | ⋮ | ... |
| Area (mm$^2$) | $a_1$ | $a_2$ | $a_3$ | $a_4$ | $a_5$ | $a_6$ | $a_7$ | $a_8$ | $a_9$ | ... |
| Throughput (mbps) | $tp_1$ | $tp_2$ | $tp_3$ | $tp_4$ | $tp_5$ | $tp_6$ | $tp_7$ | $tp_8$ | $tp_9$ | ... |
| Power (nW) | $p_1$ | $p_2$ | $p_3$ | $p_4$ | $p_5$ | $p_6$ | $p_7$ | $p_8$ | $p_9$ | ... |
| Latency (nsec) | $t_1$ | $t_2$ | $t_3$ | $t_4$ | $t_5$ | $t_6$ | $t_7$ | $t_8$ | $t_9$ | ... |
| ⋮ | ⋮ | ⋮ | ⋮ | ⋮ | ⋮ | ⋮ | ⋮ | ⋮ | ⋮ | ... |

METHOD OF ESTIMATING RESOURCE REQUIREMENTS FOR A CIRCUIT DESIGN

FIELD OF THE INVENTION

The present invention relates generally to integrated circuits, and in particular, to a method of estimating resource requirements for a circuit design.

BACKGROUND OF THE INVENTION

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). As will be described in more detail below, a programmable logic device is designed to be user-programmable so that users may implement logic designs of their choices. Application specific integrated circuits (ASICs) may also comprise programmable portions which enable the ASIC to function as a PLD. That is, in addition to the fixed hardware design implemented in an ASIC, a programmable logic portion may comprise programmable circuits.

As hardware systems become more complex, capturing their descriptions in a synthesizable language has become a very complex, time-consuming task. Recent efforts to alleviate some the complexity for designers has resulted in the evolution of computer languages into high-level languages (HLLs). Examples of such HLLs include but are not limited to the C language and all its variants, SystemVerilog, and dataflow languages such as CAL. These HLLs typically allow for complex systems to be described in significantly fewer lines of code, thus allowing the design cycle to be compressed and the time-to-market to be shorter. However, one drawback to the use of high level languages is the limited feedback and limited correlation between the source code entered by the user and the hardware that is produced. This limited feedback makes it difficult for users of HLL tools to optimize their designs. More specifically, the limited feedback of conventional devices makes it difficult to pinpoint the sections of the code that may be improved and to decipher how to modify the source code to make the improvements. Examples of some design optimizations include resource reduction, power reduction, and increasing the throughput and/or clock rate of the circuit design. Any type of feedback related to resource estimates and any impact on resources provided to the user in a simple format early in the design process would be extremely beneficial. Extending this feedback to PLDs, where circuit designs may be quickly modified multiple times, provides a significant advantage to a user.

While devices having programmable logic are beneficial to users, any tools which make these devices easier to implement may significantly benefit suppliers of these devices. That is, tools which make adopting a device having programmable logic easier for a user will not only impact the user but also the supplier of the devices. As circuit designs implemented in programmable logic become more complex and devices have greater density, it may be difficult for a user to determine whether the programmable logic will be able to accommodate the circuit design without running an implementation tool. Further, the run times of implementation tools for implementing circuit designs in programmable logic is often significant, requiring costly engineering time for a user and causing delays in implementing a circuit design in a PLD. With different devices having programmable logic being available to users, it may be difficult for a user not only to determine whether a device will accommodate the user's design, but also which device of many available devices is most appropriate for a given circuit design. Accordingly, any tools which help a user identify resource requirements without having to fully implement the circuit design in the PLD using implementation tools is beneficial.

Accordingly, there is a need for an improved method of estimating resource requirements for a circuit design early in the design process.

SUMMARY OF THE INVENTION

A method of estimating resource requirements for a circuit design is disclosed. The method comprises identifying intermediate circuit modules of a netlist associated with the circuit design; accessing a library of resource requirements for intermediate circuit modules of netlists for circuit designs; selecting intermediate circuit modules of the library according to predetermined parameters for the circuit design; and generating an estimate of resource requirements for the circuit design based upon resource requirements of the selected intermediate circuit modules. The method may further comprise displaying the estimate of resource requirements as source code for the circuit design is entered, enabling a user to change the source code in response to the estimate of the resource requirements.

According to an alternate embodiment, a method of estimating resource requirements for a circuit design comprises identifying intermediate circuit modules of a netlist associated with the circuit design; accessing a library of resource requirements for intermediate circuit modules of netlists for circuit designs; selecting intermediate circuit modules of the library according to predetermined parameters for the circuit design; determining resource requirements associated with an IP core of the netlist; and generating an estimate of resource requirements for the circuit design based upon resource requirements of the selected intermediate circuit modules and the resource requirements associated with the IP core. Identifying intermediate circuit modules of a netlist associated with the circuit design may comprise parsing and elaborating source code of the circuit design implemented in a high level language. Further, determining resource requirements associated with an IP core of the netlist may comprise accessing a library of resource requirements for the IP core.

A method of estimating resource requirements for a circuit design comprises identifying intermediate circuit modules of a netlist associated with the circuit design; accessing a library of resource requirements for intermediate circuit modules of netlists for circuit designs; selecting intermediate circuit modules of the library according to predetermined parameters for the circuit design; determining resources required to implement the circuit design based upon the netlist for the circuit design; performing an optimization of the resources required to implement the circuit design; generating an estimate of resource requirements for the circuit design based upon resource requirements of required intermediate circuit modules; and displaying the estimate of resource requirements. Performing an optimization of the resources required to implement the circuit design may comprise providing hardware independent and/or optimizations. Displaying the estimate of resource requirements may comprise displaying the estimate as source code is entered and providing a correlation to the source, wherein displaying the estimate of resource requirements may comprise displaying resource requirements a portion of the source code.

DETAILED DESCRIPTION

Programmable logic devices have a variety of architectures. Further, programmable logic may be implemented in different types of devices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell. The programmable logic elements of FPGAs and CPLDs may also be included as a part of a larger ASIC.

Figure 1:
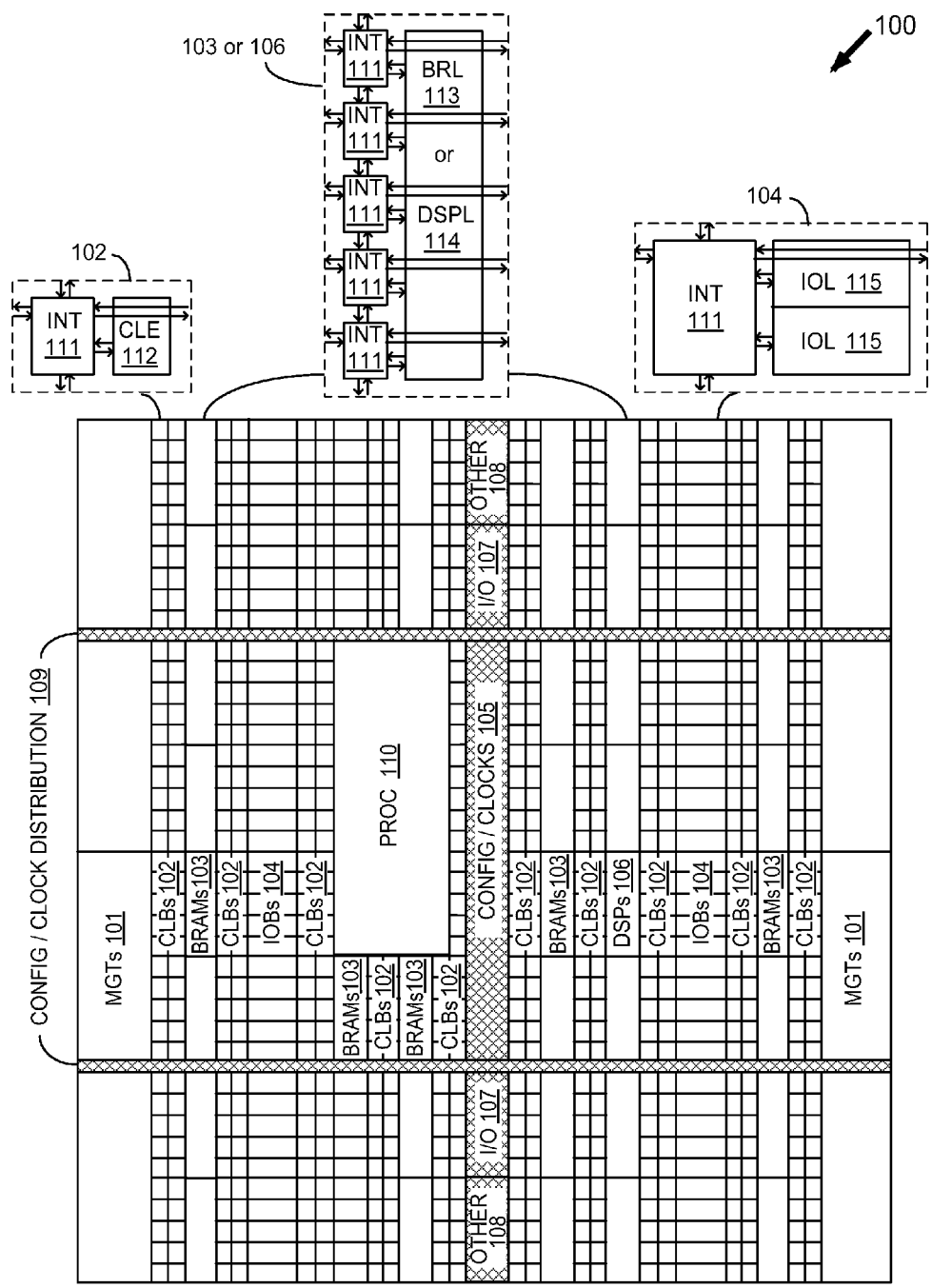
FIG. 1 is a block diagram of a device having programmable logic according to an embodiment of the present invention.

Turning first to FIG. 1, a block diagram of a device having programmable logic according to an embodiment of the present invention is shown. As shown in FIG. 1, an FPGA comprises an architecture that includes a large number of different programmable tiles comprising programmable logic including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
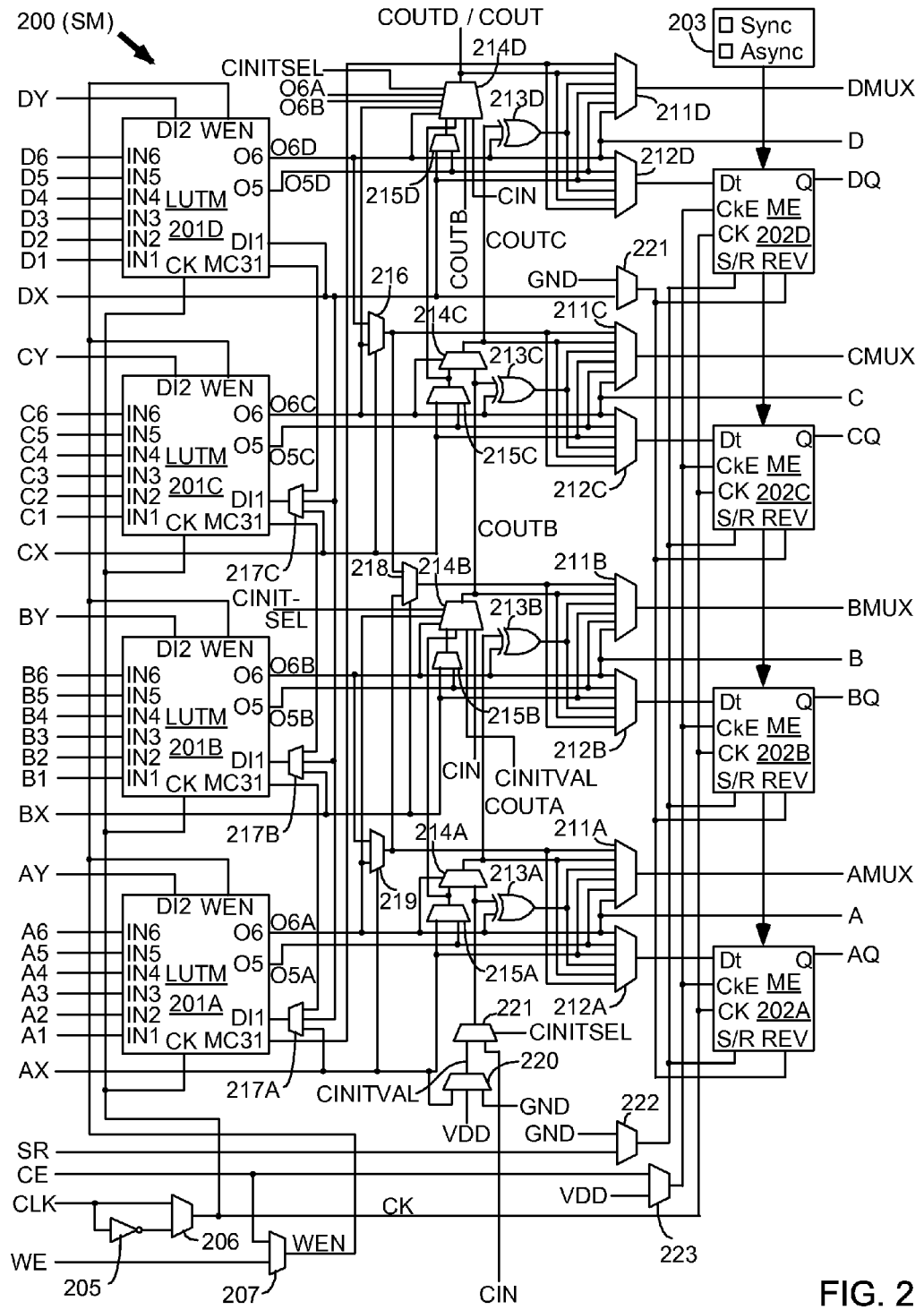
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 26 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. The devices having programmable logic and methods of the present invention may be implemented according to the device of FIGS. 1 and 2, or in any device, including any type of integrated circuit having programmable logic.

Figure 3:
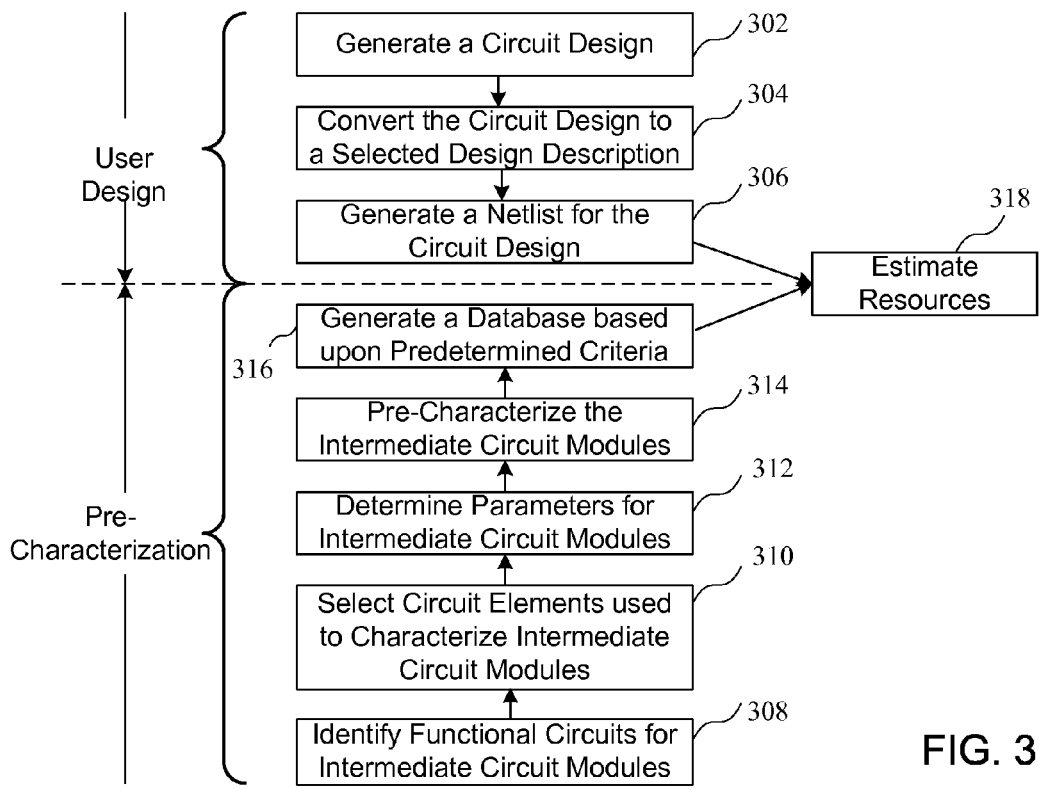
FIG. 3 is a flow diagram showing the generation of a resource estimate according to an embodiment of the present invention.

When implementing a circuit in programmable logic, it is necessary to map, pack, place and route a circuit design, as is well known in the art. That is, elements of the circuit design are mapped to certain elements of programmable logic, and packed into blocks of programmable logic, such as the programmable tiles set forth above. The various circuits which have been packed into programmable tiles are then placed at certain locations of the device, before routing is performed. Because these steps, and more particularly placement and routing, are often time consuming and require engineering and computer resources, generating estimates based upon elements of a netlist may be particularly advantageous to a user. A flow diagram of FIG. 3 shows the generation of a resource estimate based upon circuit elements of a netlist according to an embodiment of the present invention. By pre-characterizing circuit elements which will be found in netlists for circuit designs, the methods of the present invention enable estimating and relaying back to the user, early in the design process, information about the implementation of a hardware system, such as resources of a programmable logic device required for implementing a circuit design, and performance characteristics of the circuit design during execution, such as latency, throughput, area, and power estimates.

According to one aspect of the invention, a netlist generated for a particular user design is analyzed according to pre-characterization data based upon circuit elements of netlists. In particular, after a circuit design is generated as shown in block 302, the circuit design is converted to a selected design description as shown in block 304. By way of example, after a schematic of a circuit design is generated, a high level design description, such as a high level language (HLL) or a register transfer language (RTL) representation, may be provided for the circuit design. A netlist is then generated for the circuit design as shown in the block 306. While a selected design description is given by way of example as an HLL or RTL representation, it is important to note that the methods of the present invention enable generating an estimate of a circuit design based upon a netlist regardless of how the circuit design is converted to a netlist.

For example, a netlist may be generated directly from the circuit design, or some other representation of the circuit design other than an HLL or RTL representation. However, whether an HLL or RTL representation of a circuit design is used to generate a netlist may affect the resources in which the circuit elements are implemented, where an RTL representation of the circuit design may provide limited choices in how the circuit design is implemented.

Before any given circuit design is analyzed, it is necessary to pre-characterize circuit elements which may commonly be found in any netlist. A netlist is a representation of a circuit design found after tasks commonly referred to as parsing, which comprises dividing the code to be implemented into sections, and elaborating, where the parsed sections of code are converted to a netlist, are performed. The circuit elements defined in a netlist are independent of the higher level representation used to generate the netlist, and the netlist is typically independent of the hardware platform that is eventually targeted. In some cases, some netlists may be generated with circuit elements such as intellectual property (IP) cores which are specific to a targeted hardware platform, as will be described in more detail below. A netlist contains information regarding content as well as structural information and connectivity for a circuit design. More particularly, a net of a netlist represents a collection of interconnect lines from the output of a user logic block to inputs of the next destination block, while a path represents a sequence of nets between registers comprising a connection from a source to a specific destination. A path may be defined as a clock to clock path, such as one register to another register, a register to an output, an input to a register, or an input to an output, as is well known in the art. Accordingly, the methods of the present invention involve creating a mid-level view of a circuit design, by describing it in terms of a library of well-known, highly-parameterizable circuit elements of a netlist. The circuit elements of the netlist are preferably at a level which enables generating an estimate in terms of elements of a targeted device easier. As will be described in more detail below in reference to FIGS. 4-6, these circuit elements are pre-characterized for a given target device and according to predetermined input parameters.

A netlist may also contain IP cores. An IP core is a larger, pre-defined function and enables a user to complete a large design faster. That is, an IP core comprises a plurality of circuit elements normally found in a netlist. Examples of IP cores may be a finite impulse response (FIR) filter or a fast fourier transform (FFT) circuit, each of which may comprise a large number of circuit elements found in a netlist. That is, when a circuit designer needs the functionality of a FIR circuit or an FFT circuit, it is possible to select an IP core for those circuits which are predefined and ready to implement. As will be described in more detail below, the resource estimate of an IP core alone may also be determined according to methods of the present invention. In order to perform the pre-characterization of elements in the netlist, intermediate circuit modules, also called macros, comprising circuit elements defined in a netlist are identified as shown in block 308. Intermediate circuit modules may include a single element of a netlist. By way of example, the intermediate circuit modules may include an adder/subtractor, a twos-comparator, a multiplier, logical operators such as a conditional AND/OR operators, a bitwise AND/OR/XOR or a reduction-OR, logical shifters, multiplexers, counters, memories, or registers of a netlist.

In either case, the intermediate circuit modules are characterized in terms of circuit elements selected to characterize the intermediate circuit modules in block 310. For example, the intermediate circuit modules may be characterized in terms of resources commonly found in certain families of PLDs, such as LUTs, BRAMS, DSPs, or any other element described in FIGS. 1-2. The resources used to characterize the intermediate circuit modules may be a superset of all elements of a variety of devices, including elements which are not necessarily common between different families of devices. However, the characterization may include information related to the circuit elements of the netlist. As will be described in more detail below, other static and dynamic characteristics of the intermediate circuit modules may be generated. Accordingly, it may be possible to both determine whether a circuit design may be implemented in a given device, but also to benchmark a number of implementations of a circuit according to both resource and performance criteria.

Parameters, which are inputs to an intermediate circuit module or otherwise characterize the intermediate circuit module, must be determined as shown in block 312. Examples of parameters include a device family (or device within a family of devices), tool settings, number of inputs, bit widths of inputs and outputs, number of significant bits, and depths of memories. The device family enables an estimate to be generated by picking the resource requirements of the intermediate circuit modules found in the netlist that are generated for a given family. By way of example, a Virtex-4 FPGA device from Xilinx, Inc. of San Jose, Calif. has 4-input LUTs, while a Virtex-5 FPGA device has 6-input LUTs. As should be apparent, the requirements for LUTs of a given intermediate circuit module may be different based which family of device is chosen. Also, within a given family, the amount and/or configuration of memory may vary for different devices, leading to different resource estimates. As will be described in more detail below, numerous intermediate circuit modules will be defined in terms of the circuit elements of the netlist, and predetermined parameters defining the intermediate circuit module. That is, for a given circuit element of a netlist, a plurality of intermediate circuit modules are pre-characterized according to a plurality of parameter sets as shown in block 314. Finally, a database providing resource estimates of the intermediate circuit modules is generated as shown in block 316. Additional details related to generating a database comprising a table or equations representing the estimation results will be described in more detail below.

Finally, an estimate of resources is then generated for a circuit design as shown in block 318. In order to generate an estimate, both a netlist for which an estimate is to be generated and pre-characterization data are input to a resource estimation tool. The resource requirements and performance characteristics of the entire circuit design are then estimated based on the circuit elements identified in the netlist of the circuit design. Some design-level estimation techniques may also be used. For example, optimizations such as constant propagation and strength reduction (e.g., multiplying by 4 may be optimized to become a left-shift by 2) may be performed either prior to or during the resource estimation. A back-end synthesis tool, which performs placement and routing according to user-selectable tool settings, may affect the final amount of resources required by the circuit design. The estimated resources are stored in a database accessible by the user, where resources may be tagged by hierarchy, bit widths, and library element types. Because the methods of the present invention are independent of the origin of the netlist for generating a resource estimate, the methods of the present invention provides flexibility when generating a resource estimate.

The pre-characterization may involve identifying parameter sets and their value ranges to create parameter vectors.

Figures 5, 7:
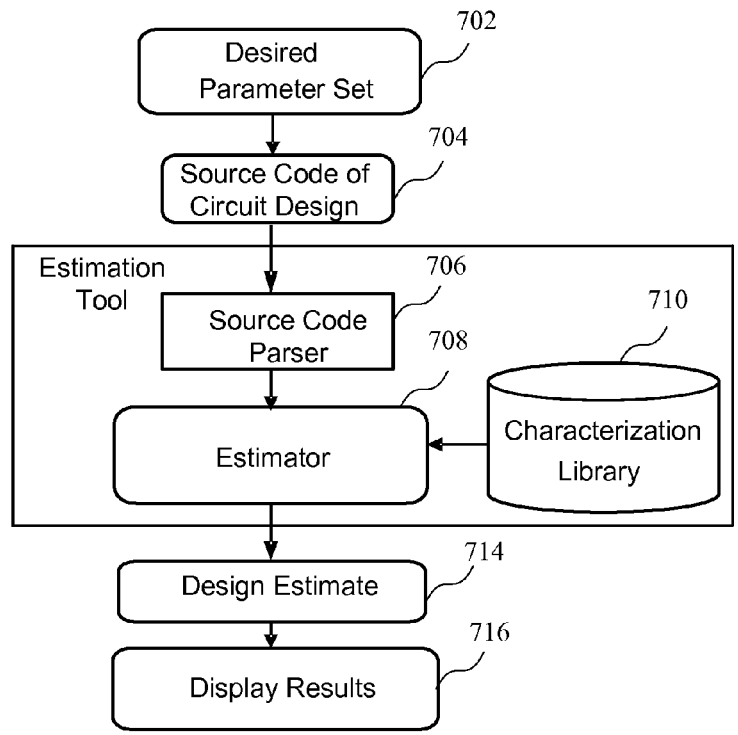
FIG. 5 is an exemplary table showing resource estimates for a plurality of parameter sets according to an embodiment of the present invention.
FIG. 7 is a flow diagram showing the creation of a resource estimate for a circuit design using a desired parameter set according to an embodiment of the present invention.

For example, three parameters with two different values each results in $2^3$ or eight vectors. Implementation tools may be run for each vector to create a table of results. By repeating this for each netlist element, a library of estimation resources may be generated. These pre-characterization results may be stored in a number of different ways. As will be described in more detail below, the data may be stored in a table of raw data as shown in FIG. 5, or some other comparison technique such as curve fitting may be performed to reduce the amount of data that is stored. After the intermediate circuit modules are characterized, the estimation tool performs tasks to enable generating an estimate for a given netlist. That is, the pre-characterization results and netlist are read, where the estimation tool performs an individual estimation on each element in the netlist based upon its parameter set. As will be described in more detail below, the estimation tool may also perform various refinements and optimizations.

It should be noted that three different software tools, namely a user interface tool, a netlist-generation tool, and an estimation tool, may be used to implement the methods of the present invention. These tools may be independent of one another or may be combined. According to one embodiment, the user interface tool and the netlist-generation tool are incorporated in a common tool, whereas the estimation tool is a provided as a standalone tool. According to an alternate embodiment, all three tools are combined in a single, common tool. It is also important to note that there are some differences with ASICs and FPGAs. Targeting a standard cell library for an ASIC enables more degrees of freedom and therefore, it may be easier to estimate what the synthesis tool will do. Conversely, an FPGA contains an assortment of hard, heterogeneous hardware elements, providing a more difficult platform for estimation. Some specific examples of this include determining the threshold bit widths when a hard multiplier/DSP is used for arithmetic functions, or determining the threshold depth and bit width when a memory will be implemented in a BlockRAM. The size of the circuit design and the size of the target part may also be considered. For example, if BlockRAMs of a device may be used up, it still may be possible to use the device if LUT RAMs are used for certain memory requirements. One advantage of the methods of the present invention is that they provide a framework that may easily be adapted to changing synthesis tools, revisions and tool settings, as well as more easily integrated into new generations of devices. Such flexibility is significant for the short-term adoption of IP developers as well as long-term usage and effectiveness, allowing minimization of the upkeep and maintenance of the framework.

Figure 4:
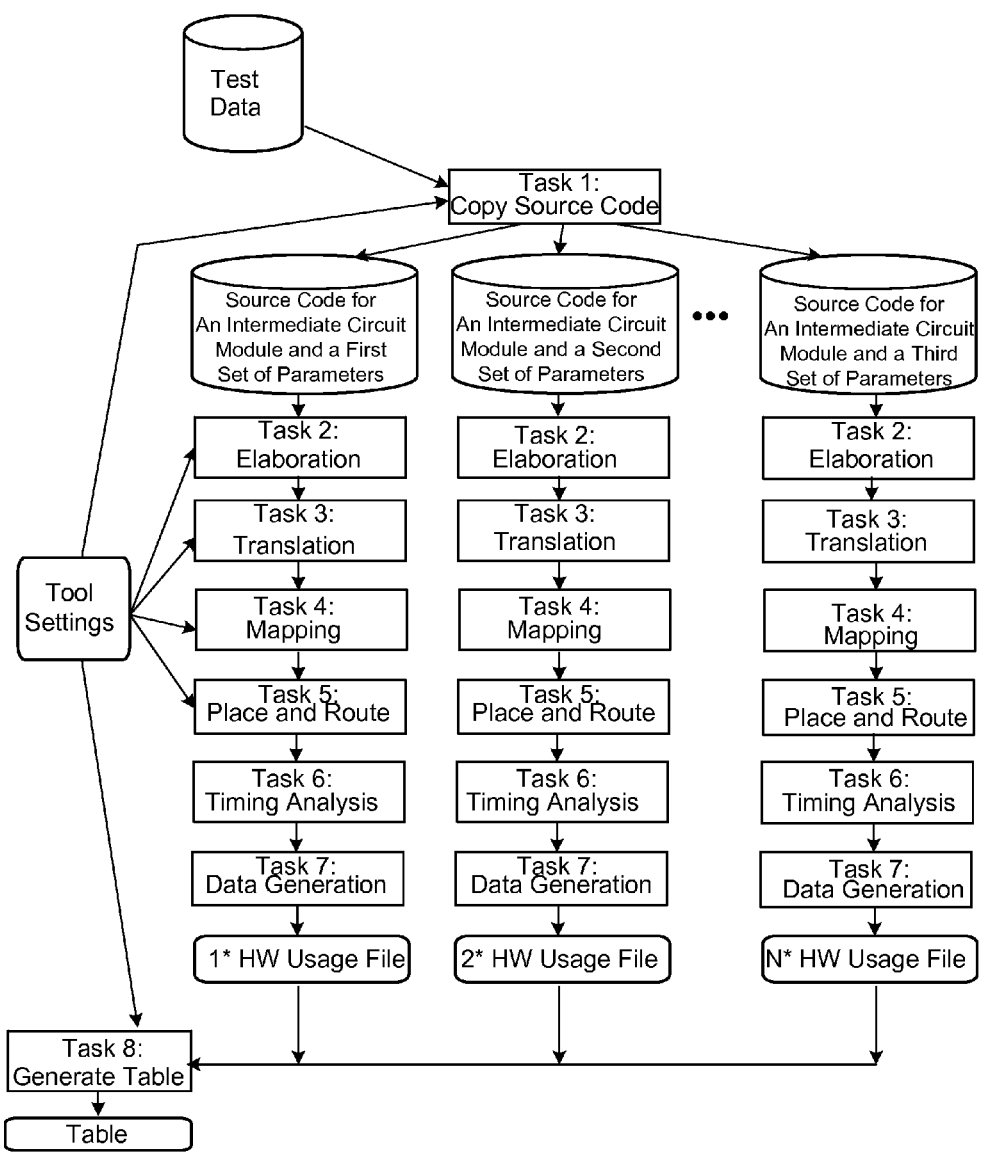
FIG. 4 is a flow diagram showing the creation of a table having resource estimates for intermediate circuit modules according to an embodiment of the present invention.

Turning now to FIG. 4, a flow diagram shows the creation of a table having resource estimates for intermediate circuit modules according to an embodiment of the present invention. A number of tasks are performed to generate pre-characterization data, shown in FIG. 4 as data in a table. A first task is to copy source code of an intermediate circuit module a predetermined number of times to generate source code for a given intermediate circuit module having a predetermined number of parameter sets. Although FIG. 4 shows a generating multiple source code for a single intermediate circuit module, it should be understood that the same procedure would be performed for each intermediate circuit module based upon parameter sets relevant to that intermediate circuit module. Further, while copying the source code a predetermined number of times is shown by way of example, the same set of source code to cover all intermediate circuit modules and all parameter sets may be used, where all cases are iterated to generate the data according to the different parameter sets. For each source code associated with a different parameter set, various tasks are performed. As shown in FIG. 4, an elaboration, as set forth above, is performed as task 2, followed by a translation step in a task 3 which is necessary for generating a file used by a mapping step in a task 4. Finally, a place and route step in performed in a task 5. It should be noted that tasks 1-5 and 8 may be affected by tool settings which may set various parameters for implementing a circuit design in a device. For example, a user may set various preferences related to size and speed of the implementation of the resulting design, or even how circuit elements of the device, such as BRAMs and LUTs, are used. Further, while certain tasks are required for generating an estimate of resources, other tasks of FIG. 4 may be required for generating estimates of other static and dynamic characteristics of the circuit design implemented in a given device. For example, while only elaboration is necessary for determining resource requirements of the circuit design, it may be necessary to perform all of the tasks up to the place and route task 5 to determine other characteristics, such as area, as well as dynamic characteristics of throughput and power requirements in the circuit. Timing analysis may be performed in a task 6, and may be used to establish another dynamic characteristic of the circuit related to latency. Finally, a data generation task in a task 7 is performed to generate a usage file for compiling a table in a task 8.

An exemplary table of FIG. 5 shows resource estimates and performance characteristics for a given intermediate circuit module according to a plurality of parameter sets is shown. In particular, a table shows nine parameters sets, where various resource requirements and performance characteristics for the parameter sets are provided. The circuit elements used to characterize the resource requirements are shown here as common elements of FPGAs, including slices, total LUTs, logic LUTs, RAM LUTs, BRAMs, and DPSs. The performance characteristics shown in table 5 include area, throughput, power and latency. By way of example, the intermediate circuit module may comprise an adder, having three parameters, each of which may have two values, where the various combinations of the parameters would lead to eight parameter sets. In general, the parameter sets may be generated using nested flow loops where a given parameter is varied while all of the remaining values remain constant. The various circuit elements used to characterize the resource requirements as well as the performance characteristics are shown by way of example, and other circuit elements and performance characteristics could be employed. Further, it should be noted that the table of FIG. 5 is a simplified table. The number of intermediate circuit modules and the actual parameter sets for a given intermediate circuit module would be significantly greater than shown in the table. As will be described in more detail below, because the significant volume of data in a table of estimation results, there may be a need to reduce the amount of data which pre-characterizes a given intermediate circuit module.

Accordingly, these library elements are pre-characterized with each element given a unique cost function. That is, each intermediate circuit module having a plurality of parameters sets may have one cost function for each kind of characteristic that is to be estimated (e.g. resources, area, power, throughput, latency, clock rate, etc.) and specific for the FPGA family targeted, based on such criteria as the number of inputs, the number of those inputs that are constants, the value of those constants, and the bit widths of inputs and output signals. When possible, the cost functions for the elements are expressed as empirical formulas with the above-mentioned input parameters as variables to make the estimation faster and extendable to an entire range of parameter values. Unlike conventional estimation tools which involve resource estimations of specific library elements that are instantiated into a given design, generating estimates based on elements that are inferred from a high level description of the circuit design allows a more dynamic estimation of the circuit design. Further, the methods of the present invention go beyond just estimating FPGA resources by providing estimates for dynamic characteristics of the circuit design.

Figure 6:
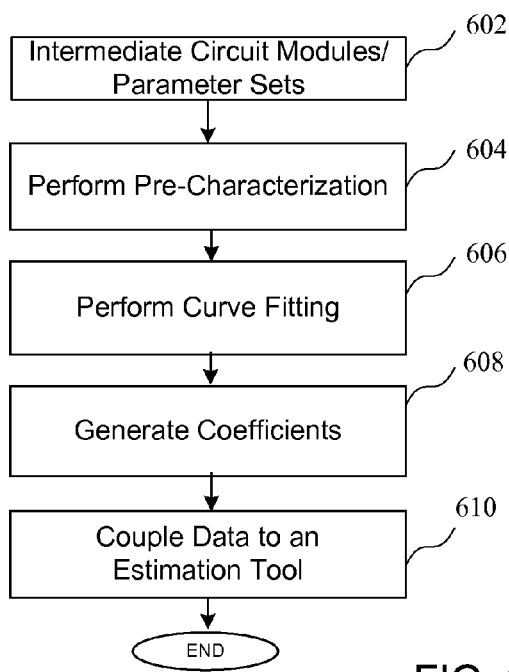
FIG. 6 is a flow diagram showing the generation of data to be used by an estimation tool according to an embodiment of the present invention.

Turning now to FIG. 6, a flow diagram shows the generation of data to be used by an estimation tool according to an embodiment of the present invention. There are a number of different ways to store characterization results. While the raw data may be stored in a table as shown in FIG. 5, regression analysis such as curve fitting could be used to reduce the amount of data. This technique finds a curve or function that best maps the input parameters to the output results. Typically, this is done to improve performance/speed; enable filling in the gaps of the input characterization results using interpolation or extrapolation; and reducing the storage requirements by using equation coefficients rather than tables of raw results. After intermediate circuit modules and parameter sets are identified in a block 602, a pre-characterized function is performed in a block 604 as set forth above. A curve fitting function may then be performed to reduce the volume of data necessary to pre-characterize the intermediate circuit modules in a block 606, and coefficients are generated in a block 608. Finally, pre-characterization data is coupled to an estimation tool in a block 610. Additional details related to curve fitting will be described in more detail in reference to FIG. 15.

Turning now to FIG. 7, a flow diagram shows the creation of a resource estimate for a circuit design using a desired parameter set according to an embodiment of the present invention. According to the embodiment of FIG. 7, a single resource estimate is generated, where a desired parameter set is selected in block 702 and source code of a circuit design is provided to an estimation tool as shown in block 704. The estimation tool comprises a source code parser 706, such as a hardware description language (HDL) parser, which inputs a parsed source code to an estimator 708. The estimator also receives data from a characterization library 710. The characterization library may include raw data of a table or functions characterizing the data as set forth above. The estimation tool generates a design estimate 714 and displays results 716. That is, the estimator evaluates the intermediate circuit modules identified in the netlist generated by the HDL parser, and uses estimation data from the characterization library to generate the design estimate as set forth above. The estimation tool may be implemented using any general purpose computer, and may be a part of another tool for enabling the implementation of a programmable logic device.

According to one embodiment the invention, a second stage of pre-characterization may enable an estimation tool to optimize the circuit design by recognizing a certain arrangement of circuit elements of the netlist, and assign that arrangement of circuit elements to a specific circuit element of the target device in which the circuit design is being implemented. By way of example, a certain configuration of circuit elements, such as a configuration of adders, multipliers and registers, may comprise a multiplier accumulator (MACC). By recognizing this arrangement of elements, it may be optimal to implement the MACC circuit in a DSP block of the device. The estimator could recognize the configuration of circuit elements of a MACC and generate an estimate based upon implementing a MACC in a given device. That is, the estimator will generate an estimate targeting certain devices. For example, it may generate an estimate for a Virtex-2 device which has no MACC elements wherein the resource requirements for the MACC would be estimated in terms of LUTs, or a Virtex-4 device having hard-wired MACC elements where the resource requirements would be estimated in terms of DSP blocks. Alternatively, the optimization may be performed by a tool generating a netlist, where the netlist would include an intermediate circuit module for a MACC circuit. The resource requirements for this MACC circuit may then be determined by a separate table for the MACC circuit estimating the elements of the MACC circuit alone, or by generating an estimate based upon the circuit elements of the MACC.

Figure 8:
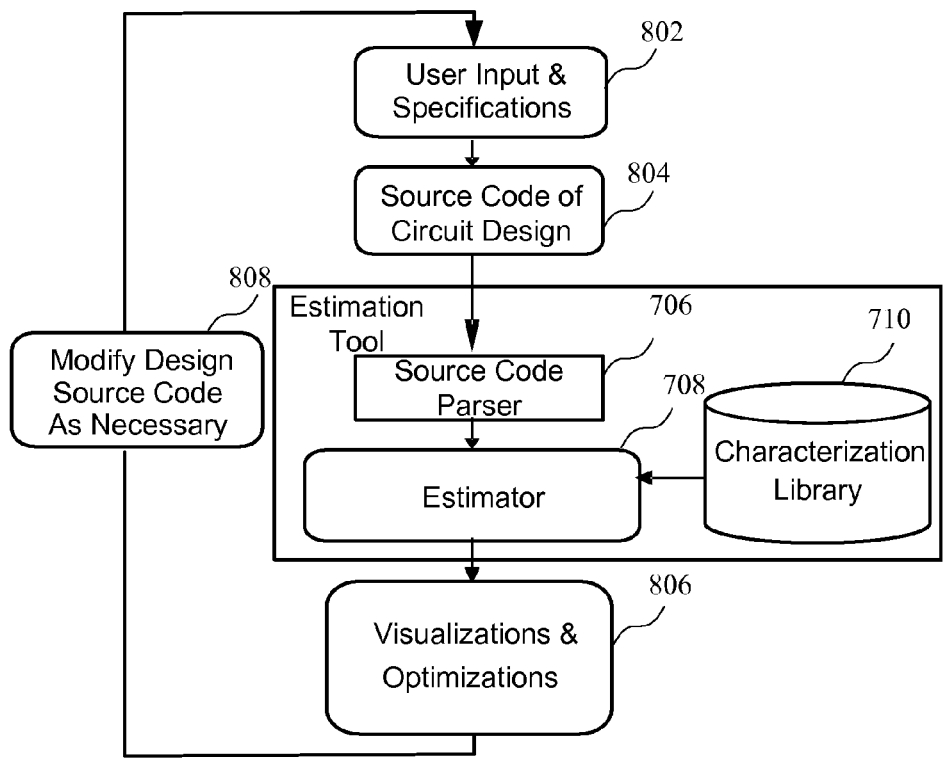
FIG. 8 is a flow diagram showing the display of a resource estimate for a circuit design during the creation of the circuit design according to an embodiment of the present invention.

Turning now to FIG. 8, a flow diagram shows the display of a resource estimate for a circuit design during the creation of the circuit design according to an embodiment of the present invention. As shown in the embodiment of FIG. 8, feedback is provided to a user to enable optimizations of a circuit design while the user is entering source code for the circuit design. In particular, after user inputs and specifications are selected as shown in block 802, source code of the circuit design is provided to an estimation tool as shown in block 804. The estimation tool generates a design estimate with various visual feedbacks related to resource requirements and performance, as well as information related to the optimization of the circuit design, as shown in block 806. A user may then modify the source code as shown in block 808, where new user inputs may be provided to the estimation tool. The various visualizations and optimizations techniques will be described in more detail below.

Figure 9:
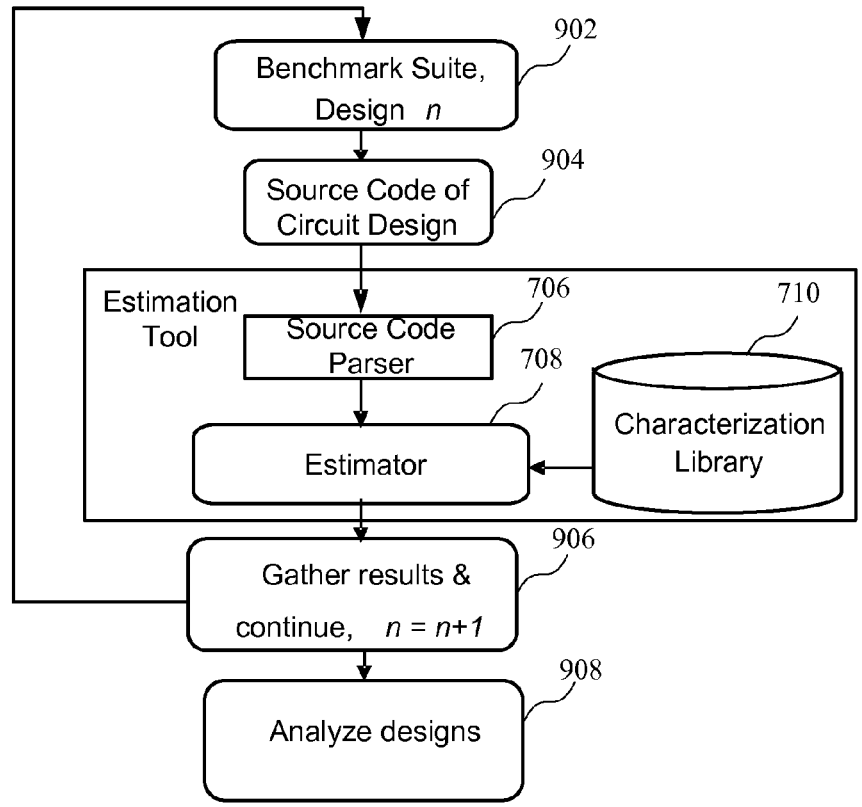
FIG. 9 is a flow diagram showing a method of benchmarking a circuit design based upon a plurality of parameter sets according to an embodiment of the present invention.

Turning now to FIG. 9, a flow diagram shows a method of benchmarking a circuit design according to an embodiment of the present invention. According to the embodiment of FIG. 9, various circuit designs or a circuit design implemented according to a plurality of parameter sets enables a user to benchmark one or more circuit designs. In particular, a first design "n" of a benchmark suite of designs is provided as shown in block 902. According to the embodiment of FIG. 9, the benchmark suite of designs may comprise a single design having a plurality of parameter sets, or a plurality of different designs. Source code of the design "n" is provided to an estimation tool as shown in block 904. The estimation tool generates a resource estimate, and the next design is then provided to the estimation tool until the resource estimates for all of the designs have been generated, enabling the results to be analyzed as shown in block 908.

Figure 10:
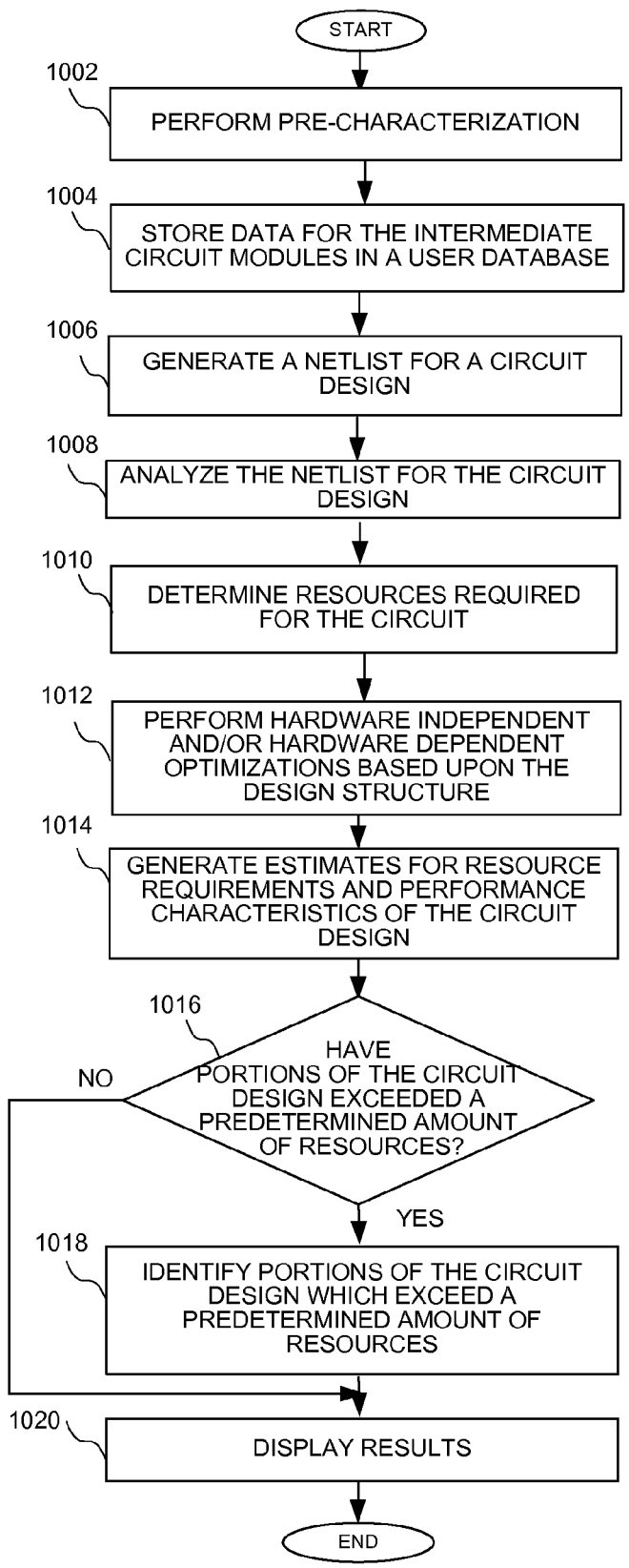
FIG. 10 is a flow chart showing a method of estimating resource requirements of a circuit design according to an embodiment of the present invention.

Turning now to FIG. 10, a flow chart shows a method of estimating resource requirements of a circuit design according to an embodiment of the present invention. A pre-characterization of intermediate circuit modules is performed at a step 1002. The pre-characterization may be performed according to any of the embodiments set forth above. Data for the intermediate circuit modules is stored in a user database at a step 1004. The data may be a table of raw data or equations generated as a result of a regression analysis, such as curve fitting. A netlist for a circuit design is then generated at a step 1006, and analyzed at a step at a step 1008. Resources required to implement the circuit design are determined at a step 1010. Hardware independent and/or hardware dependent optimizations are performed based upon the structure of the design at a step 1012. That is, based upon the design structure of the circuit design in the netlist, as well as the resources of the target device, some optimizations may be made to more accurately estimate the intermediate circuit modules of the netlist which are actually required. While some mapping may be required to implement the optimizations, the estimations of resources for the circuit design may be more accurate. Examples of the hardware dependent and hardware independent optimizations are described below in reference to FIGS.

12 and 13. An estimation of the resource requirements and a performance characterization of the circuit design are then generated at a step 1014. It should be noted that steps 1010-1014 could be performed separately, or in one loop iteration. For example, after the estimator determines identifies a multiplier, the context of the design structure could also be examined to determine if the multiplier is a part of a MACC, and if so, consume the adder, muxes and registers also. It is then determined whether any portions of the circuit design have exceeded a predetermined amount of resources at a step 1016. If so, the portions of the circuit design which exceed the predetermined amount of resources are identified at a step 1018. The results are then displayed at a step 1020. For example, the resource estimates could be cross-referenced to the line(s) of source code and highlighted with the code. Additional details regarding the display of resource estimates will be described in reference to FIG. 16. According to one embodiment of the invention, the estimation of resource requirements may be stored in a hierarchical database. Therefore, portions of the design may be modified, and new estimates based upon those portions of the design may be stored. For larger designs, this implementation would reduce the time required to generate an estimate because a new estimate would be generated only for a portion of a design.

Figure 11:
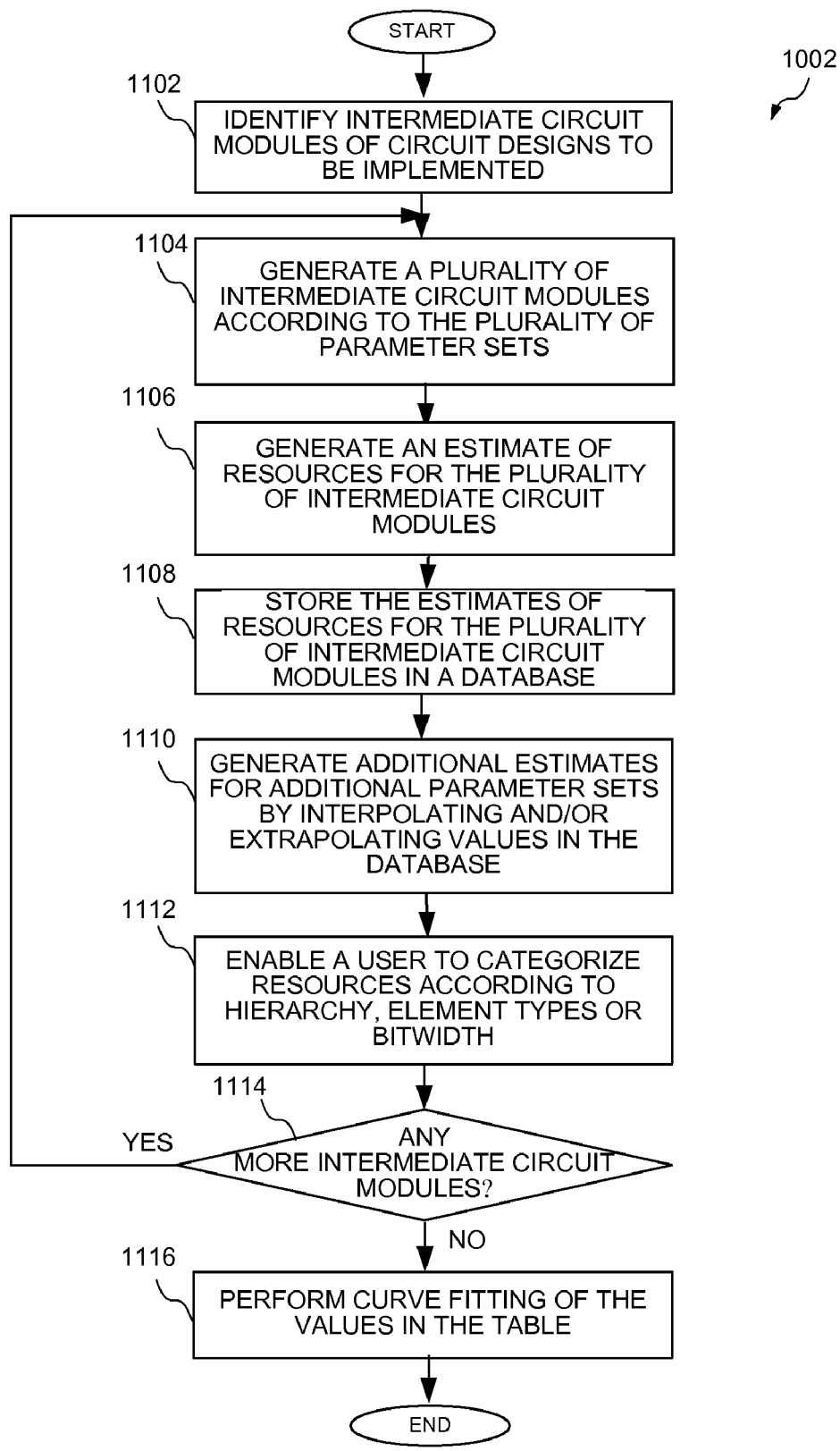
FIG. 11 is a flow chart showing a method of generating data used by an estimation tool for estimating resource requirements of a circuit design according to an embodiment of the present invention.

Turning now to FIG. 11, a flow chart shows a method of generating data used by an estimation tool for estimating resource requirements of a circuit design according to an embodiment of the present invention. Intermediate circuit modules of circuit designs to be implemented are identified at a step 1102. A plurality of intermediate circuit modules is characterized according to a plurality of parameter sets at a step 1104. An estimate of resources for the plurality of intermediated circuit module for each of the parameter sets is generated at a step 1106, and stored in a database at a step 1108. Additional estimates may be generated for additional parameter sets by interpolating and/or extrapolating values in the database at a step 1110. A user may then categorize the resources according to hierarchy, element types or bit width at a step 1112. It is then determined if there are any more intermediate circuit modules for which characterization data should be generated at a step 1114. If not, curve fitting of the values in the table is performed at a step 1116, as will be described in more detail in reference to FIG. 15.

Figure 12:
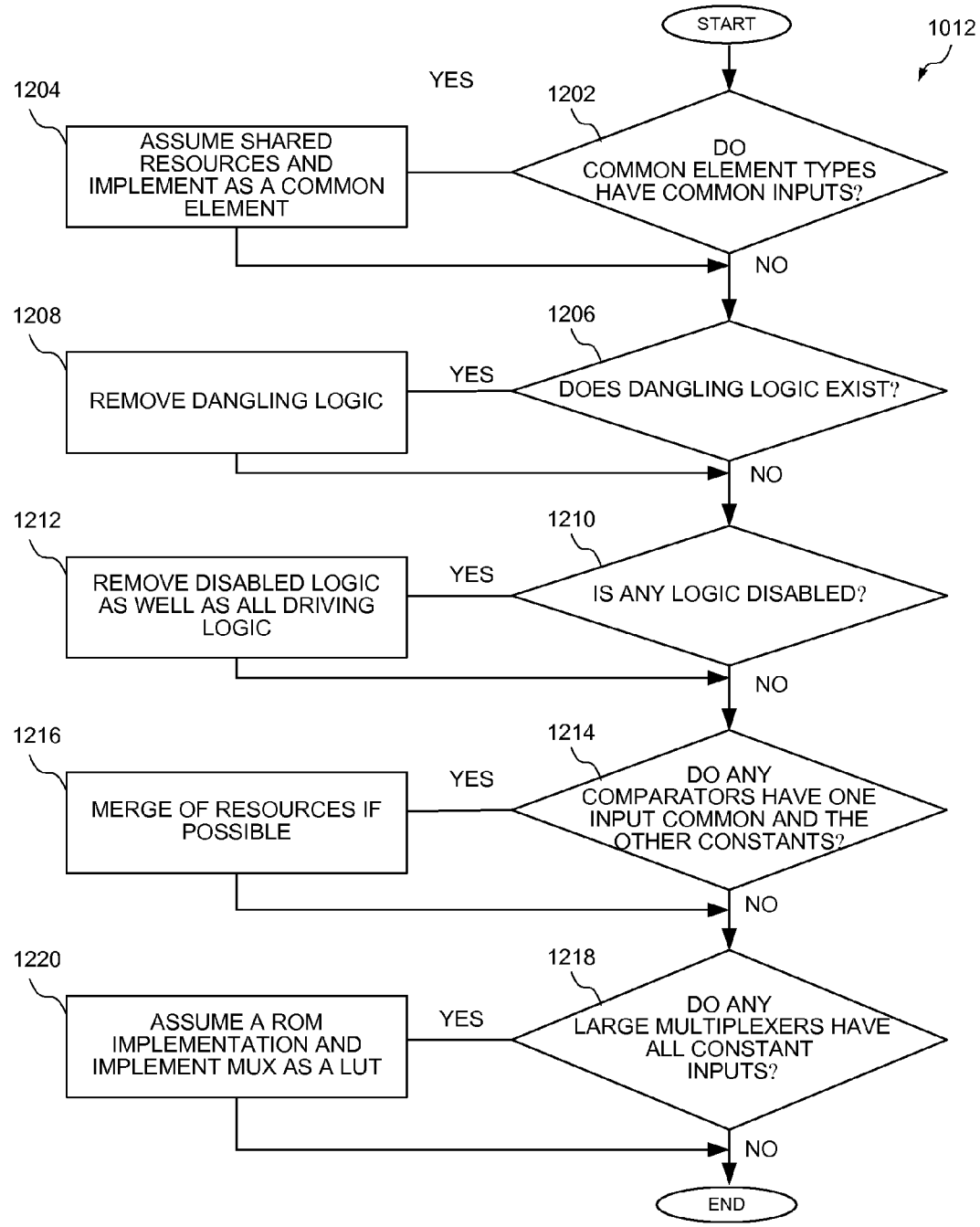
FIG. 12 is a flow chart showing a method of performing hardware independent refinements of a circuit design for improving an estimate of resource requirements according to an embodiment of the present invention.

Turning now to FIG. 12, a flow chart shows a method of performing hardware independent refinements of a circuit design for improving an estimate of resource requirements according to an embodiment of the present invention. It is first determined whether common element types have common inputs at a step 1202. If so, it is assumed that the resources are shared resources and are therefore implemented as a common element at a step 1204. It is also determined whether dangling logic exist at a step 1206. Dangling logic may exist if an output is not driving anything. If so, the dangling logic is removed at a step 1208. It is then determined if there is any disabled logic at a step 1210. For example, disabled logic may exist if a select signal of a multiplexer is permanently set to select a given input. If so, the disabled logic as well as all driving logic is removed at a step 1212. It is then determined whether any comparators have one input common and the other constants at a step 1214 If so, the resources are merged if possible at a step 1216. Finally, it is determined whether any large multiplexers have all constant inputs at a step 1218. If so, it is assumed to be a ROM implementation and the multiplexer is implemented as a ROM at a step 1220.

Figure 13:
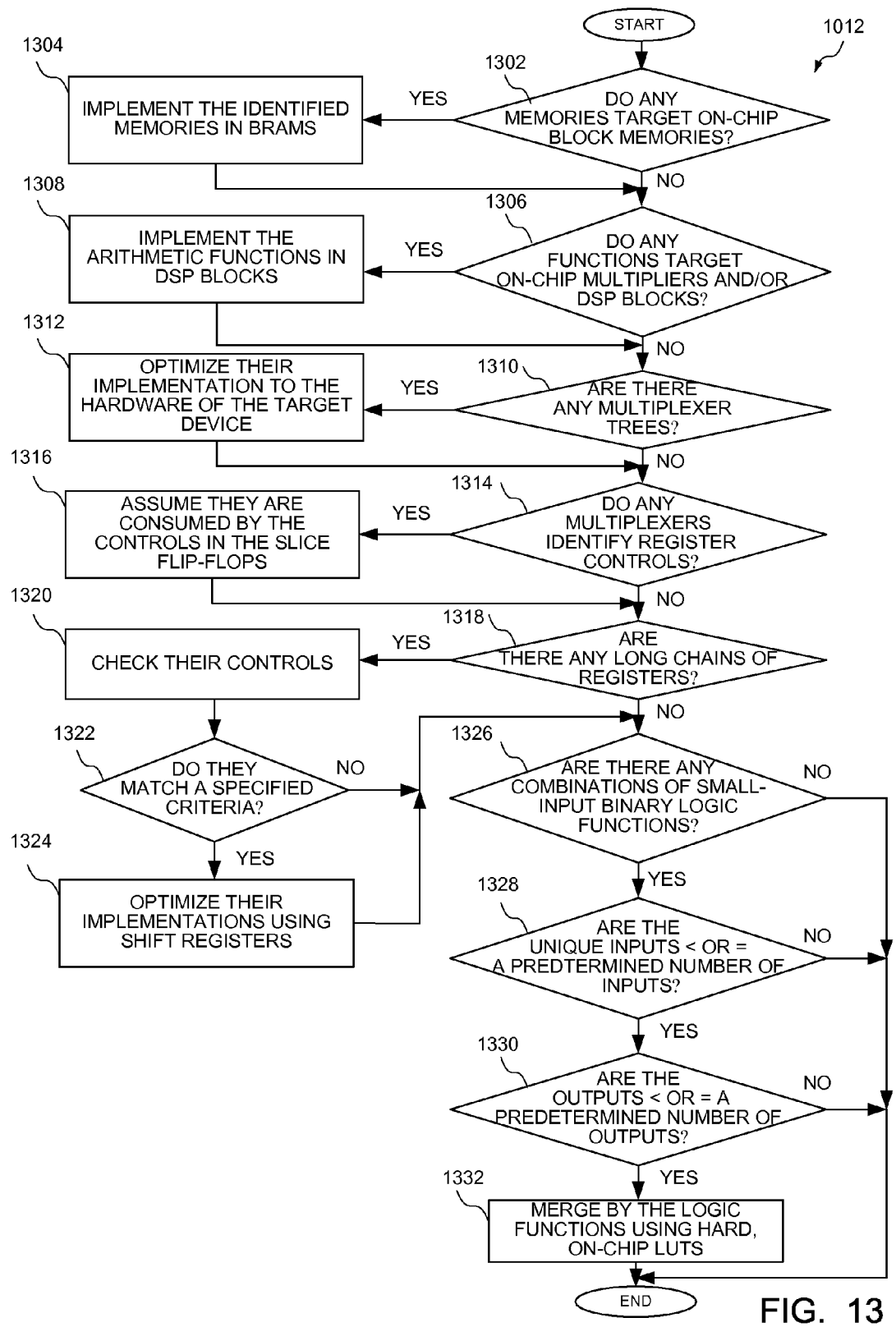
FIG. 13 is a flow chart showing a method of performing hardware dependent refinements of a circuit design for improving an estimate of resource requirements according to an embodiment of the present invention.

Turning now to FIG. 13, a flow chart shows a method of performing hardware dependent refinements of a circuit design for improving an estimate of resource requirements according to an embodiment of the present invention. It is first determined if any memories and their supporting hardware target hard, on-chip block memories at a step 1302. If so, the identified memories are implemented in BRAMS at a step 1304. It is then determined whether any arithmetic functions and their supporting hardware target hard, on-chip multipliers and/or DSP blocks at a step 1306. If so, the arithmetic functions are implemented in on-chip multipliers and/or DSP blocks at a step 1308. The determinations performed in steps 1302 and 1306 involve a combination of information, such as bit widths, depths of memories, number of types of ports for memories, use of constants in multipliers, and settings for implementation and/or tools, for example. It is then determined whether there are any multiplexer trees at a step 1310. If so, their implementation is optimized to the hardware of the target device at a step 1312. It is then determined whether any multiplexers identify register controls at a step 1314. If so, it is assumed that they are consumed by the controls in the slice flip-flops at a step 1316. It is then determined whether there are any long chains of registers at a step 1318. If so, the controls are checked at a step 1320. It is then determined if the controls match a specified criteria at a step 1322. If so, their implementations are optimized using shift registers at a step 1324. It is then determined if there are any combinations or trees of binary logic functions at a step 1326. If so, it is determined if a number of unique inputs is less than or equal to a predetermined number of inputs on a LUT of the device at a step 1328. It is also determined if a number of outputs less than or equal to a predetermined number of outputs on the LUT at a step 1330. In determining parameters for logic optimizations during synthesis, an empirical formula may be employed based upon an evaluation of actual data. For example, it may be determined that N times the number of LUT inputs, where N is determined to be 3, provides the optimal results when determining whether enough inputs are available to combine logic. If the inputs are less than or equal to the predetermined number of inputs and the outputs are less than the predetermined number of outputs, the logic functions are merged by using hard, on-chip LUTs at a step 1332. While some examples of hardware independent and hardware dependent optimizations are shown, other optimizations may be performed.

Figure 14:
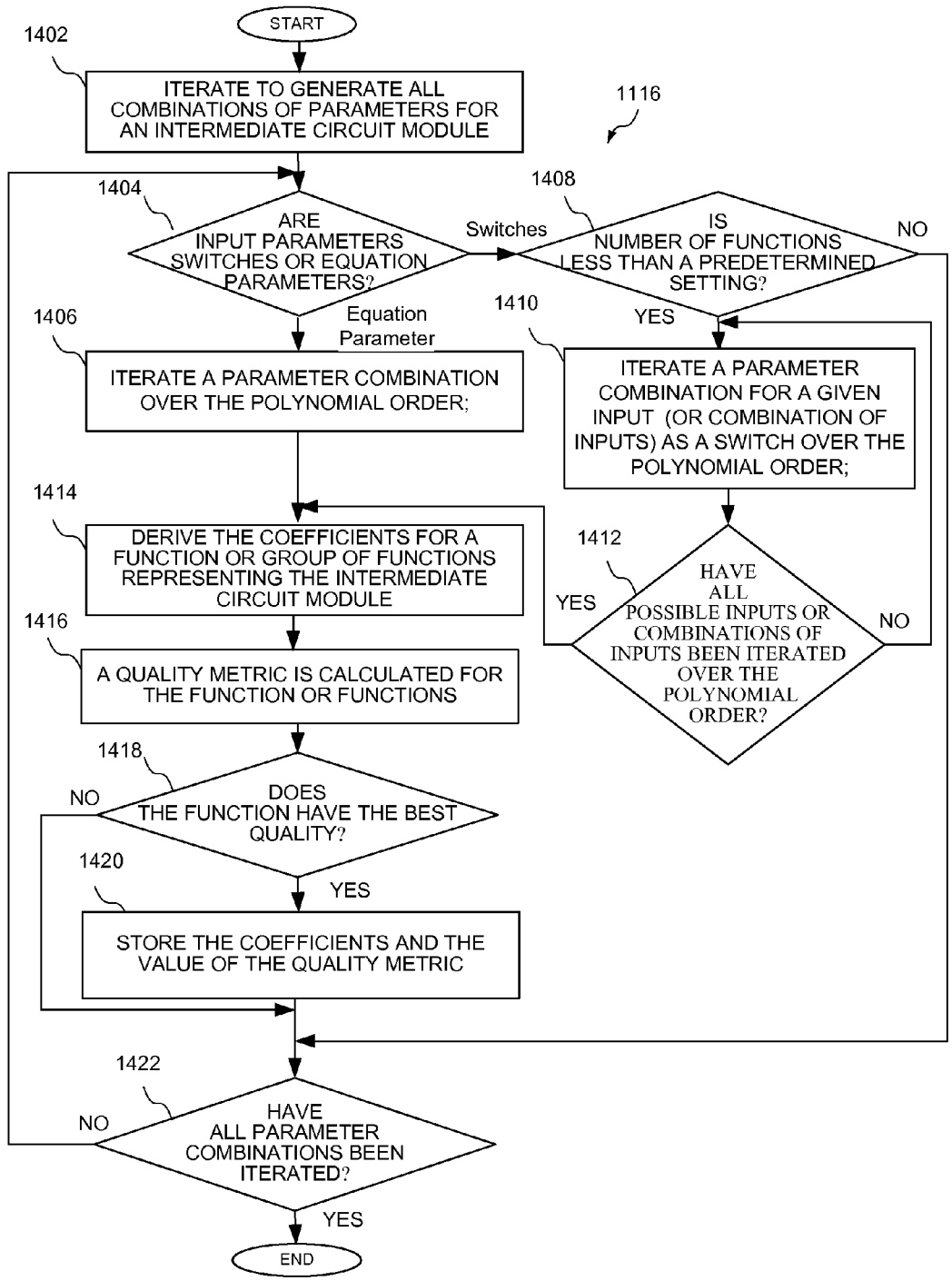
FIG. 14 is a flow chart showing steps of performing curve fitting of data for generating a resource estimate according to an embodiment of the present invention.

Turning now to FIG. 14, a flow chart shows steps of performing curve fitting of data for generating a resource estimate according to an embodiment of the present invention. In the context of resource estimation, the curve fitting is preferably run at the end of the pre-characterization stage performed on each library intermediate circuit module and for each target hardware platform. That is, the raw characterization results for the intermediate circuit module having a plurality of parameter sets for an intermediate circuit module are curve-fitted and stored for use by the estimation tool. The input parameters defining the parameter sets may be either polynomials in the functions or switches between different, unique functions. Multiple parameters may also be switches between functions. The different functions are automatically generated with auto-selection of order of polynomials, number of functions, and the selection of the switches between functions. Preferably, the user sets the maximum order of polynomials and the maximum number of functions when performing curve fitting.

By way of example, a table could be assembled for a large group of intermediate circuit modules, where data is provided for each intermediate circuit module according to associated parameter sets for that intermediate circuit module. For a given intermediate circuit module, a function may then be generated based upon all of the data in the table related to that intermediate circuit module. Accordingly, a single function such as a polynomial equation may be used to represent the data in the table, where resource requirements for that intermediate circuit module may be determined by applying selected values for parameters in the function.

However, in some cases, a given parameter may be used as a "switch", where a separate function is determined for each value of a parameter of a switch. The selection of one or more parameters as a switch, and the generation of multiple equations characterizing the data in a table related to an intermediate circuit module, may lead to more accurate functions characterizing the data. For example, for certain intermediate circuit modules, the resource requirements may vary significantly for different devices, and therefore the device parameter may be a switch. That is, a single function for the intermediate circuit module may not accurately characterize the resource requirements across different types of devices, and a function for each type of device leads to a much more accurate characterization of the data in the table. Accordingly, a separate function is generated for each possible value of an input parameter, in this case for each type of device. According to another example, different input widths for a certain type of intermediate circuit module may lead to significantly different resource estimation results, making a single function representing data associated with the intermediate circuit module inaccurate. Because different resources of a target device may be used depending upon the input width, a switch point for an input width may be 8, where an estimation of resources for input widths at 7 or below may be significantly different than an estimation of resources for input widths at 8 or above. Therefore, two functions may be generated to characterize the data for that intermediate circuit module. It should be noted in this case, the selection of a particular device may not have an impact on the resource requirements for implementing the intermediate circuit modules.

However, multiple parameters may also be selected as switches, and a function is generated for each combination of possible values for the parameters selected as switches. A simple example is provided for showing the number of functions which would be generated based upon multiple parameters which are selected as switches. A resource estimate may be determined based upon three parameters A, B and C which may be selected as switches, where parameter A has two possible inputs, parameter B has three possible inputs, and parameter C has four possible inputs. Because the number of possible combinations of input parameters is the product of the possible values of the parameters selected as switches, the number of different equations would be a product of the possible input values for the parameters selected as switches. For example, if input parameters A and B were selected as switches, there would be 6 possible combinations of input values, and therefore 2 times 3 or 6 equations defining the resource requirements in terms of the remaining input parameters which are equation parameters. However, it is important that the number of equations defining the intermediate circuit module does not exceed a limit for equations which may be selected by a user. For example, if a maximum of 7 equations may be used to characterize a given intermediate circuit module, selecting parameters A and B as switches, leading to 6 equations, would be acceptable. However, selecting parameters B and C as switches, leading to 12 possible combinations of input values, and therefore 12 functions defining the intermediate circuit module, would not be acceptable.

Referring specifically now to FIG. 14, an iteration step is performed to generate all combinations of parameters for a circuit design at a step 1402. It is then determined whether the input parameters are switches or equation parameters at a step 1404. If none of the input parameters are switches, a single function is generated by iterating over the polynomial order at a step 1406. That is, a function will be generated where all of the parameters are variables in the function. However, if certain inputs parameters are switches, it is then determined whether the number of functions required to characterize the data is less than or equal to the maximum allowed functions at a step 1408. If so, a parameter combination for a given input selected as a switch or combination of input values selected as switches is iterated over the polynomial order at a step 1410. It is then determined whether all of the possible input combinations of values selected as a switch have been iterated over the polynomial order at a step 1412. If not, additional parameter combinations will be iterated until all combinations have been iterated. The coefficients for a function or functions representing the intermediate circuit module are then derived at a step 1414.

A quality metric is calculated for the function or group of functions at a step 1416. It is then determined whether the function or group of functions have the best quality at a step 1418. For example, the quality of the function or group of functions may be determined by comparing the estimated resource requirements to actual resource requirements for the circuit design. It should be noted that a single function characterizing all of the data for a given intermediate circuit module may be generated even if some input parameters may be selected as switches. That is, it may be determined that a single function better characterizes the data, even if may have been considered that the selection of certain parameters as switches would better characterize the data. If a certain function or group of functions for selected parameters is determined to have the highest quality, the coefficients and the value of the quality metric are then stored at a step 1420. It is then determined whether all parameter combinations have been iterated at a step 1422. If not, another parameter combination will be iterated over the polynomial order at a step 1404. While curve fitting is described by way of example as one method of characterizing the data, other regression analysis techniques or other techniques to compress the data could be performed.

Figure 15:
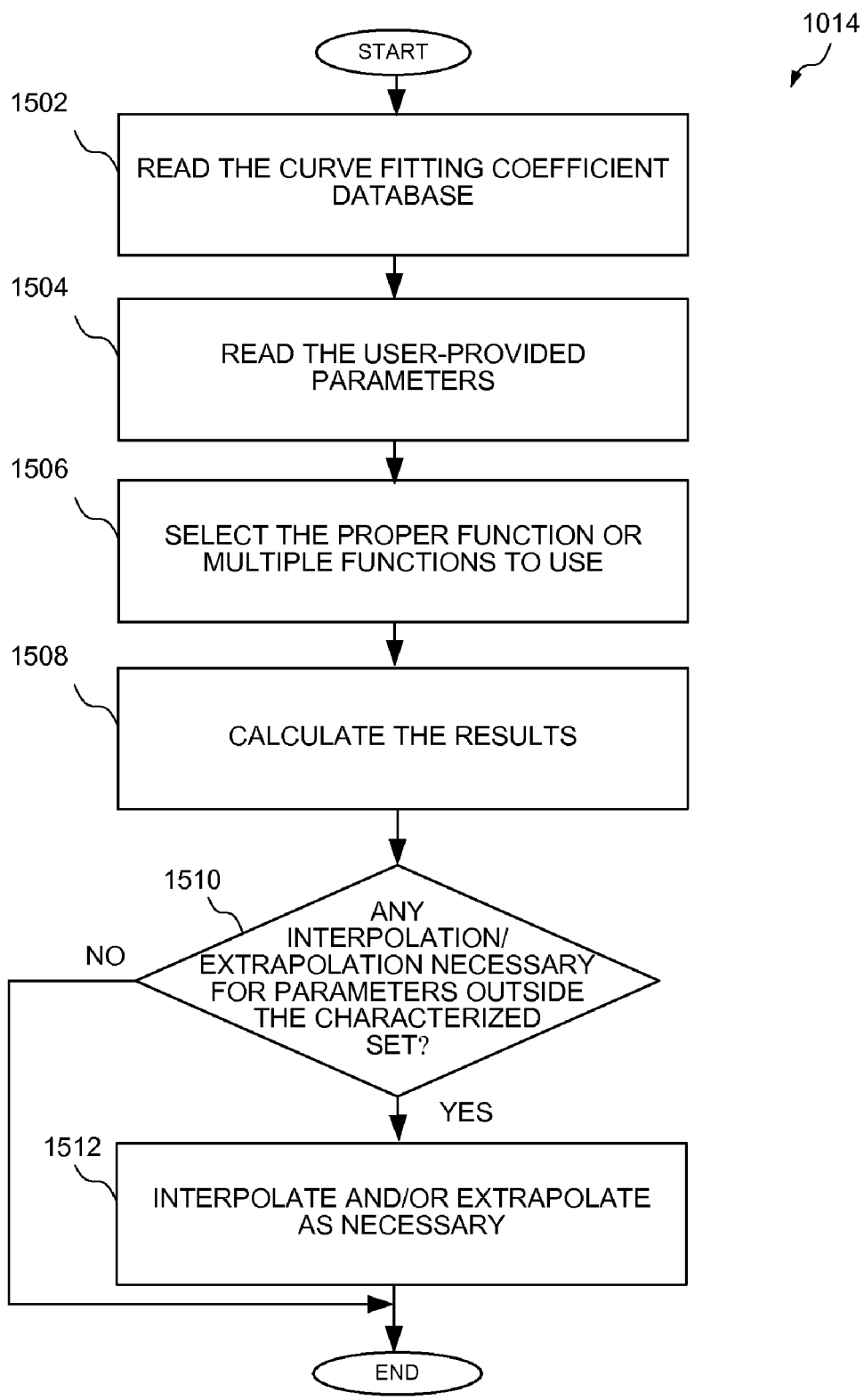
FIG. 15 is a flow chart showing a method of generating an estimate using curve fit data according to an embodiment of the present invention.

Turning now to FIG. 15, a flow chart shows a method of generating an estimate using curve fit data according to an embodiment of the present invention. In particular, the curve fitting coefficient database is read at a step 1502. The user-provided parameters are then read at a step 1504. The proper function or multiple functions to be used are selected based upon the user-provided parameters at a step 1506, and the results are calculated at a step 1508. It is then determined whether any interpolation/extrapolation is necessary for parameters outside the characterized set at a step 1510. If so, the interpolation and/or extrapolation is performed as necessary at a step 1512. By way of example, an estimation tool reads the curve fitting coefficient database; and reads the user-provided parameters, which may indicate that an intermediate circuit module comprising a FIR filter core having 15 bits and 1024 taps is to be implemented in a Virtex-4 device. The proper function or multiple functions are selected to be used, and the results are calculated. The user provided parameters may be read ahead of time and loaded to save time. The tools may also perform any necessary interpolation/extrapolation for parameters outside the characterized set. For example, if 15 bits was not characterized for a FIR filter core, it may be possible to run 14 and 16 bits, and then interpolate the results. That is, all the same parameters except for 14 bit and 16 bit may be used, assuming that bit width is a switch. The interpolation may be linear interpolation, or the interpolation may be bilinear or tri-linear as needed.

Figure 16:
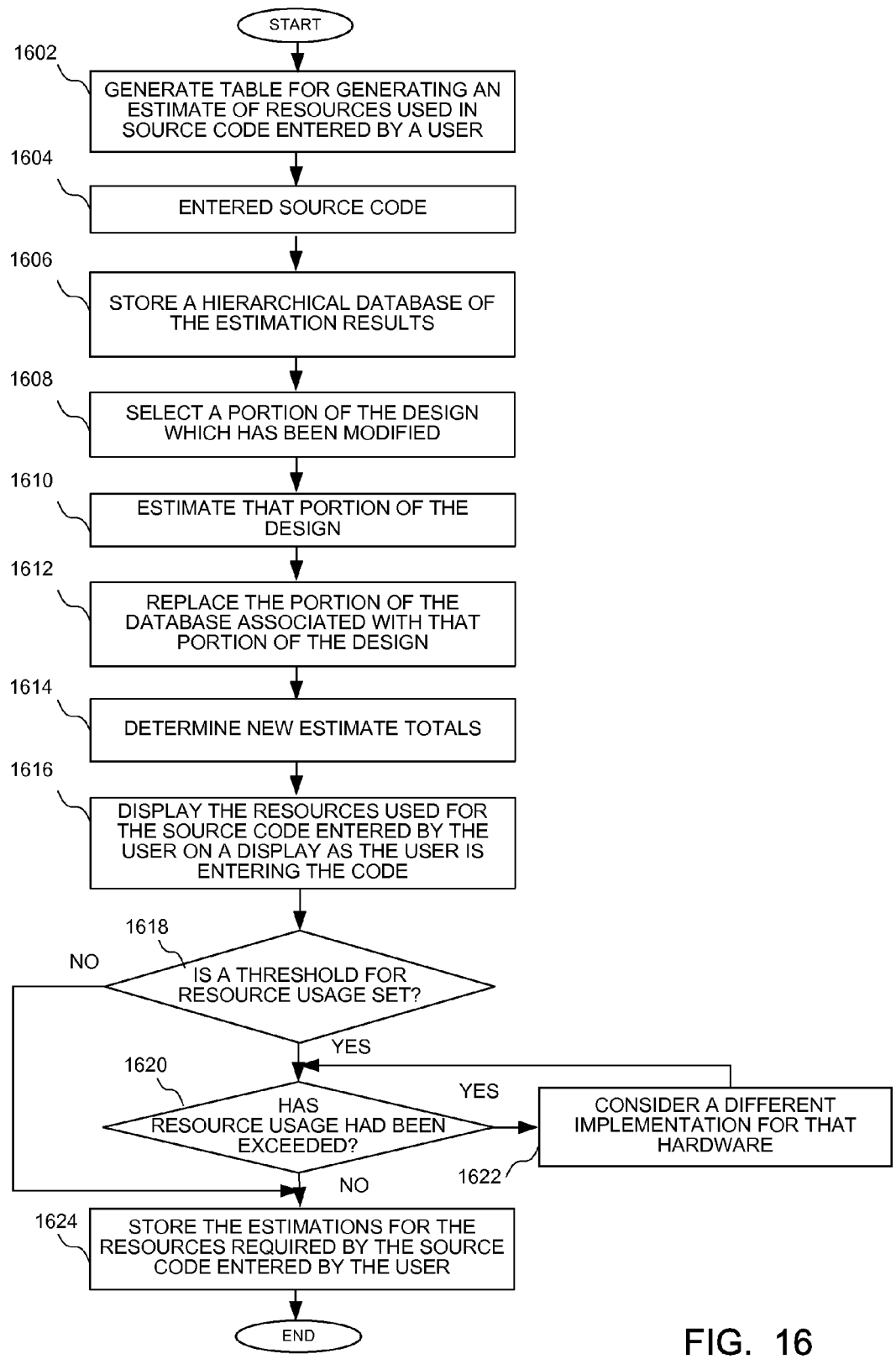
FIG. 16 is a flow chart showing the implementation of a user interface for generating a resource estimate of a circuit design according to an embodiment of the present invention.

Finally, turning to FIG. 16, a flow chart shows steps of implementing a user interface for generating a resource estimate of a circuit design according to an embodiment of the present invention. As shown in FIG. 16, tables are created for generating an estimate of resources used in source code entered by a user at a step 1602. Source code is then entered by a user at a step 1604. A hierarchical database is used to store the estimation results at a step 1606. For example, a database may be generated to enable resource requirements for the circuit design to be accessed according to various criteria, such as the various input parameters. While the methods of the present invention enable resource requirements of an entire design to be estimated, a portion of a design may be selected to be modified at a step 1608, and an estimate of that portion of the design is generated at a step 1610. That portion the estimate is replaced in the resource estimate database for the circuit design at a step 1612, and a new total estimate is determined at a step 1614. The resources used for the source code entered by the user are displayed on a display as the user is entering the code at a step 1616. Various features for displaying the estimates are described in more detail below. It is then determined whether a threshold for resource usage is set at a step 1618. If so, it is determined whether resource usage had been exceeded at a step 1620. If so, the netlist generation tool may consider a different implementation for that hardware at a step 1622. Finally, the estimations for the resources required by the source code entered by the user are then stored at a step 1624.

It should be noted that information related to the design is fed back to the user in a simple, easy-to-read fashion, and tied to the hierarchy of the design for easier deciphering by the user. This technique provides immediate feedback to the user regarding source code and synthesis settings, and allows for a comparison of FPGA families and architectures, as well as design space exploration or DSE. DSE involves modifying the settings of the synthesis tools based on the estimated resources of the circuit design. Because a single HLL description of a circuit design may be synthesized to multiple different hardware implementations, estimating implementation properties is important in the analysis of a circuit design. That is, in order to do the resource estimation properly, it must have intimate knowledge of the down-chain tool settings.

The methods of the present invention also provide a user with resource estimates early in the design process. Further, the methods enable immediate feedback to a user to allow for source code evaluation and optimizations without performing a full place and route to target a device. The information may also be provided to the user in a hierarchical fashion so that optimizations may be pinpointed to specific high-level language constructs in the source code. The resource estimates are also made available during high-level synthesis so that the design may be made to fit into the desired FPGA.

According to another embodiment, the resource estimation is performed as a background task, either on the user's computer, a networked cluster of computers, or any combination of computer resources as is well known in the art. Given a known set of synthesis parameters, the estimation procedure could be either initiated by the user selecting a menu option or automatically performed as a background task as the user is editing the source code for the circuit design. The most recent estimated statistics may be displayed to the user directly on a graphical user interface (GUI) as the source code is being edited. The feedback may comprise a red light/green light indication or a numerical indication to provide "on-the-fly" feedback as the source code is entered. Since there is an established correlation between the estimates and the HLL constructs, "hot spots" may be highlighted in the editor and pinpointed for the user to help optimize the design. The user may also decide to interact with the database of resources and display the resources in a desired fashion. As described above, exemplary categories that may be used by the user to view the database could include but are not limited to element types, bit widths, and hierarchy.

A database is created by the netlist-generation tool that maps language constructs of the source code to elements in the netlist. This database may contain file names and line number(s) in the source code, hierarchy information if it is a shared resource, or combinations thereof. The database above is supplemented by a second database created by an estimation tool which maps the elements in the netlist to estimated hardware resources and characteristics. This may include one-to-many mappings for shared resources. These two databases are used by the user interface tool to provide linkage of language constructs to estimated hardware. According to one embodiment, direct links between source code and hardware resources are displayed on a GUI. Common formats such as tables and graphs may also be used. These databases may be updated by either a user request or automatically in the background on a host machine. These updates may be done on an incremental basis. That is, if the user is only editing one part of the code, then only that portion is sent to the estimation tool. This would be particularly important if run in background mode. The estimation information may be in the form of a searchable database, where the user may request that the information be categorized by such things as bit width, element types/categories (e.g., arithmetic elements, muxes, memories), hierarchy, or any combination thereof. The user interface tool may highlight hot spots (e.g., all constructs that produce hardware>100 FPGA LUTs) in the design automatically based upon user selected thresholds. The user preferably may also be able to select these thresholds. Based on these hot spots, the user may make requests to a netlist-generation tool to consider different implementations for that hardware.

The various methods of the present invention may be embodied in a computer-readable storage medium comprising computer executable code, and may be implemented in a computer system. A CD ROM having code for implementing various aspects of the present invention is attached as a part of this application. The code reproduced in this patent document contains material subject to copyright protection. The copyright owner of that material has no objection to the facsimile reproduction of the patent document or the patent disclosure, as it appears in the Patent and Trademark Office patent files or records, but otherwise reserves all copyright rights.

It can therefore be appreciated that the new and novel method of generating data for estimating implementation requirements for a circuit design has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of estimating resource requirements for a circuit design, the method comprising:
   identifying intermediate circuit modules of a netlist associated with the circuit design;
   accessing a library of resource requirements for intermediate circuit modules of netlists for circuit designs;
   selecting intermediate circuit modules of the library according to predetermined parameters for the circuit design; and generating, by a computer, an estimate of resource requirements for the circuit design based upon resource requirements of the selected intermediate circuit modules.

2. The method of claim 1 further comprising displaying the estimate of resource requirements as source code for the circuit design is entered.

3. The method of claim 2 further comprising enabling a user to change the source code in response to the estimate of the resource requirements.

4. The method of claim 1 wherein identifying intermediate circuit modules comprises parsing and elaborating source code for the circuit design before generating the estimate of resource requirements.

5. The method of claim 4 further comprising categorizing the estimation results in a searchable database.

6. The method of claim 1 wherein generating an estimate of resource requirements comprises applying parameter values for the circuit design to functions in the library of resource requirements.

7. The method of claim 1 wherein generating an estimate of resource requirements comprises interpolating data in the library of resource requirements.

8. A method of estimating resource requirements for a circuit design, the method comprising:
   identifying intermediate circuit modules of a netlist associated with the circuit design;
   accessing a library of resource requirements for intermediate circuit modules of netlists for circuit designs;
   selecting intermediate circuit modules of the library according to predetermined parameters for the circuit design;
   determining resource requirements associated with an IP core of the netlist; and
   generating, by a computer, an estimate of resource requirements for the circuit design based upon resource requirements of the selected intermediate circuit modules and the resource requirements associated with the IP core.

9. The method of claim 8 wherein identifying intermediate circuit modules of a netlist associated with the circuit design comprises parsing and elaborating source code of the circuit design implemented in a high level language.

10. The method of claim 8 wherein determining resource requirements associated with an IP core of the netlist comprises accessing a library of resource requirements for the IP core.

11. The method of claim 8 wherein determining resource requirements associated with an IP core of the netlist comprises generating an estimate based upon intermediate circuit modules of a netlist for the IP core.

12. The method of claim 8 further comprising identifying portions of the circuit design which have exceeded predetermined resource thresholds.

13. The method of claim 8 wherein generating an estimate of resource requirements comprises interpolating values from the library of resource requirements for intermediate circuit modules.

14. The method of claim 8 wherein generating an estimate of resource requirements comprises extrapolating values from the library of resource requirements for intermediate circuit modules.

15. A method of estimating resource requirements for a circuit design, the method comprising:
   identifying intermediate circuit modules of a netlist associated with the circuit design;
   accessing a library of resource requirements for intermediate circuit modules of netlists for circuit designs;
   selecting intermediate circuit modules of the library according to predetermined parameters for the circuit design;
   determining resources required to implement the circuit design based upon the netlist for the circuit design;
   performing an optimization of the resources required to implement the circuit design;
   generating, by a computer, an estimate of resource requirements for the circuit design based upon resource requirements of required intermediate circuit modules; and
   displaying the estimate of resource requirements.

16. The method of claim 15 wherein performing an optimization of the resources required to implement the circuit design comprises providing hardware independent optimizations.

17. The method of claim 15 wherein performing an optimization of the resources required to implement the circuit design comprises providing hardware dependent optimizations.

18. The method of claim 15 wherein displaying the estimate of resource requirements comprises displaying the estimate as source code is entered and providing a correlation to the source code.

19. The method of claim 15 wherein displaying the estimate of resource requirements comprises displaying resource requirements a portion of the source code.

20. The method of claim 19 wherein displaying the estimate of resource requirements comprises displaying results based upon predetermined thresholds for resources, wherein a different implementation may be provided for a portion of code that exceeds a predetermined threshold.

* * * * *